(12) United States Patent
Daubenspeck et al.

(10) Patent No.: US 10,049,897 B2
(45) Date of Patent: Aug. 14, 2018

(54) EXTRUSION-RESISTANT SOLDER INTERCONNECT STRUCTURES AND METHODS OF FORMING

(71) Applicant: GLOBALFOUNDRIES INC., Grand Cayman (KY)

(72) Inventors: Timothy H. Daubenspeck, Colchester, VT (US); Jeffrey P. Gambino, Gresham, OR (US); Christopher D. Muzzy, Burlington, VT (US); Wolfgang Sauter, Burke, VT (US); Timothy D. Sullivan, Underhill, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 13 days.

(21) Appl. No.: 15/421,737

(22) Filed: Feb. 1, 2017

(65) Prior Publication Data

US 2017/0148754 A1    May 25, 2017

Related U.S. Application Data

(62) Division of application No. 13/610,262, filed on Sep. 11, 2012, now Pat. No. 9,607,862.

(51) Int. Cl.
*H01L 21/306* (2006.01)
*H01L 23/498* (2006.01)
(Continued)

(52) U.S. Cl.
CPC ........ *H01L 21/563* (2013.01); *H01L 23/3121* (2013.01); *H01L 23/3142* (2013.01); *H01L 23/3192* (2013.01); *H01L 24/05* (2013.01); *H01L 24/11* (2013.01); *H01L 24/13* (2013.01); *H01L 24/16* (2013.01); *H01L 24/27* (2013.01); *H01L 24/32* (2013.01); *H01L 24/73* (2013.01);
(Continued)

(58) Field of Classification Search
None
See application file for complete search history.

(56) References Cited

U.S. PATENT DOCUMENTS 6,329,605 B1    12/2001 Beroz et al.
6,472,763 B2 *  10/2002 Fukuda .................. H01L 24/10
                                                    257/772

(Continued)

FOREIGN PATENT DOCUMENTS

CN    102083269 A    6/2011
JP    2011142185 A    7/2011
JP    2011254112 A    12/2011

*Primary Examiner* — Julio J Maldonado
*Assistant Examiner* — Abbigale Boyle
(74) *Attorney, Agent, or Firm* — David Cain; Hoffman Warnick LLC (57) ABSTRACT

Various embodiments include methods of forming interconnect structures, and the structures formed by such methods. In one embodiment, an interconnect structure can include: a photosensitive polyimide (PSPI) layer including a pedestal portion; a controlled collapse chip connection (C4) bump overlying the pedestal portion of the PSPI layer; a solder overlying the C4 bump and contacting a side of the C4 bump; and an underfill layer abutting the pedestal portion of the PSPI and the C4 bump, wherein the underfill layer and the solder form a first interface separated from the PSPI pedestal.

9 Claims, 9 Drawing Sheets

(51) Int. Cl.
 *H01L 21/56* (2006.01)
 *H01L 23/31* (2006.01)
 *H01L 23/00* (2006.01)

(52) U.S. Cl.
 CPC ... *H01L 23/49811* (2013.01); *H01L 2224/024* (2013.01); *H01L 2224/0401* (2013.01); *H01L 2224/05023* (2013.01); *H01L 2224/05024* (2013.01); *H01L 2224/05082* (2013.01); *H01L 2224/05113* (2013.01); *H01L 2224/05124* (2013.01); *H01L 2224/05147* (2013.01); *H01L 2224/05155* (2013.01); *H01L 2224/05166* (2013.01); *H01L 2224/05181* (2013.01); *H01L 2224/05184* (2013.01); *H01L 2224/05186* (2013.01); *H01L 2224/05613* (2013.01); *H01L 2224/05647* (2013.01); *H01L 2224/05655* (2013.01); *H01L 2224/05666* (2013.01); *H01L 2224/05681* (2013.01); *H01L 2224/05686* (2013.01); *H01L 2224/11912* (2013.01); *H01L 2224/131* (2013.01); *H01L 2224/13023* (2013.01); *H01L 2224/13076* (2013.01); *H01L 2224/13078* (2013.01); *H01L 2224/13082* (2013.01); *H01L 2224/13113* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/13181* (2013.01); *H01L 2224/13184* (2013.01); *H01L 2224/13186* (2013.01); *H01L 2224/73104* (2013.01); *H01L 2224/73204* (2013.01); *H01L 2924/0132* (2013.01); *H01L 2924/04941* (2013.01); *H01L 2924/04953* (2013.01); *H01L 2924/07025* (2013.01); *H01L 2924/14* (2013.01)

(56) References Cited

U.S. PATENT DOCUMENTS

| | | | |
|---|---|---|---|
| 6,930,032 | B2 | 8/2005 | Sarihan et al. |
| 7,173,828 | B2 | 2/2007 | Lin et al. |
| 7,286,358 | B2 | 10/2007 | Rodriguez |
| 7,417,326 | B2 * | 8/2008 | Ikumo ................. H01L 23/3171 257/737 |
| 7,974,044 | B1 | 7/2011 | Myers et al. |
| 8,030,746 | B2 | 10/2011 | Tan |
| 8,115,293 | B2 | 2/2012 | Moon et al. |
| 8,158,508 | B2 | 4/2012 | Lin et al. |
| 2004/0188819 | A1 | 9/2004 | Farnworth et al. |
| 2005/0191836 | A1 | 9/2005 | Tzeng et al. |
| 2006/0049516 | A1 | 3/2006 | Wang et al. |
| 2007/0287279 | A1 | 12/2007 | Daubenspeck et al. |
| 2008/0111250 | A1 | 5/2008 | Melville et al. |
| 2008/0149369 | A1 * | 6/2008 | Kawamura ......... H01L 21/4846 174/251 |
| 2008/0194095 | A1 | 8/2008 | Daubenspeck et al. |
| 2009/0174045 | A1 * | 7/2009 | Arvin ................. H01L 23/49811 257/676 |
| 2010/0171206 | A1 | 7/2010 | Chu et al. |
| 2011/0063815 | A1 | 3/2011 | Lu et al. |
| 2011/0095435 | A1 | 4/2011 | Volant et al. |
| 2011/0304042 | A1 | 12/2011 | Lin et al. |

* cited by examiner

EXTRUSION-RESISTANT SOLDER INTERCONNECT STRUCTURES AND METHODS OF FORMING

FIELD

The subject matter disclosed herein relates to integrated circuits. More particularly, the subject matter relates to integrated circuit interconnect structures and methods of forming such structures.

BACKGROUND

One conventional approach for connecting integrated circuit (IC) chips (or, die) to a larger substrate (or, wafer) is to use ball grid array (BGA) interconnects, also referred to as solder ball (or solder bump) packaging. This interconnect packaging utilizes solder balls to form both physical and electrical connections between the IC chip and the substrate. The BGA interconnect packaging further includes an underfill material which surrounds the solder balls and sits between the chip and the substrate. The underfill material is conventionally flowed in around and in between the solder balls to fill spaces created by the separated solder balls which connect the chip and substrate. This underfill material conventionally forms a supportive matrix which helps to prevent solder fatigue or wear-out, and improves the long-term reliability of the BGA interconnect.

However, these conventional BGA interconnect structures experience several problems. In some cases, the BGA interconnects experience "solder extrusion", where reflowed solder used to form the BGA interconnect exerts an outward pressure on the underfill material, in particular, at the interface of the underfill material and the polyimide layer on the chip. This pressure can degrade the bond between the underfill material and the chip (via the polyimide layer), and can further delaminate the underfill material proximate the interface of the underfill and the chip.

BRIEF DESCRIPTION

Various embodiments of the disclosure described include methods of forming interconnect structures, and the structures formed by such methods. In one embodiment, a method can include: providing a precursor interconnect structure having: a photosensitive polyimide (PSPI) layer; a controlled collapse chip connection (C4) bump overlying the PSPI layer; and a solder overlying the C4 bump and contacting a side of the C4 bump. The method can further include recessing a portion of the PSPI layer adjacent to the C4 bump to form a PSPI pedestal under the C4 bump. The method can additionally include forming an underfill abutting the PSPI pedestal and the C4 bump, wherein the underfill and the solder form an interface separated from the PSPI pedestal.

A first aspect of the disclosure includes a method. The method can include: providing a precursor interconnect structure having: a photosensitive polyimide (PSPI) layer; a controlled collapse chip connection (C4) bump overlying the PSPI layer, the C4 bump including: a pad; a ball limiting metallurgy (BLM) layer over the pad; and a copper pedestal over the BLM layer; and a solder overlying the copper pedestal and contacting a side of the copper pedestal and the BLM layer; recessing a portion of the PSPI layer adjacent to the C4 bump to form a PSPI pedestal under the C4 bump; and forming an underfill abutting the PSPI pedestal and the solder, wherein the underfill and the solder form an interface separated from the PSPI pedestal.

A second aspect of the disclosure includes another method. This method can include: providing a precursor interconnect structure having: a photosensitive polyimide (PSPI) layer; a controlled collapse chip connection (C4) bump overlying the PSPI layer; and a solder overlying the C4 bump and contacting a side of the C4 bump; recessing a portion of the PSPI layer adjacent to the C4 bump to form a PSPI pedestal under the C4 bump; and forming an underfill abutting the PSPI pedestal and the C4 bump, wherein the underfill and the solder form an interface separated from the PSPI pedestal.

A third aspect of the disclosure includes an interconnect structure. The interconnect structure can include: a photosensitive polyimide (PSPI) layer including a pedestal portion; a controlled collapse chip connection (C4) bump overlying the pedestal portion of the PSPI layer; a solder overlying the C4 bump and contacting a side of the C4 bump; and an underfill layer abutting the pedestal portion of the PSPI and the C4 bump, wherein the underfill layer and the solder form an interface separated from the PSPI pedestal.

A fourth aspect of the disclosure includes an interconnect structure. The interconnect structure can include an interconnect structure having: a photosensitive polyimide (PSPI) layer including a pedestal portion; a controlled collapse chip connection (C4) bump overlying the pedestal portion of the PSPI layer, wherein the C4 bump includes: a pad; a ball limiting metallurgy (BLM) layer over the pad; and a thick copper layer over the BLM layer; a solder overlying the C4 bump and contacting a side of the C4 bump, wherein the solder is completely isolated from the PSPI layer; and an underfill layer abutting the pedestal portion of the PSPI and the C4 bump, wherein the underfill layer and the solder form a first interface separated from the PSPI pedestal.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuits. More particularly, the subject matter relates to integrated circuit interconnect structures and methods of forming such structures.

As described herein, these conventional BGA interconnect structures experience several problems. In some cases, the BGA interconnects experience "solder extrusion", where reflowed solder used to form the BGA interconnect exerts an outward pressure on the underfill material, in particular, at the interface of the underfill material and the polyimide layer (e.g., a photosensitive polyimide, or PSPI) on the chip. This pressure can degrade the bond between the underfill material and the chip (via the polyimide layer), and can further delaminate the underfill material proximate the interface of the underfill and the chip.

In contrast to the conventional approaches, various embodiments of the invention include interconnect structures, and methods of forming such structures. The structure is formed in such a manner as to prevent the solder from contacting the PSPI layer and causing issues related to solder extrusion and delamination. That is, in particular embodiments described herein, interconnect structures are formed by recessing the PSPI layer to a point below the C4 bump, and forming underfill material in the recess, thereby eliminating the three-material (solder-underfill-PSPI) interface present in the prior art.

In various particular embodiments, a method is disclosed. The method can include: providing a precursor interconnect structure having: a photosensitive polyimide (PSPI) layer; a controlled collapse chip connection (C4) bump overlying the PSPI layer, the C4 bump including: a pad; a ball limiting metallurgy (BLM) layer over the pad; and a copper pedestal over the BLM layer; and a solder overlying the copper pedestal and contacting a side of the copper pedestal and the BLM layer; recessing a portion of the PSPI layer adjacent to the C4 bump to form a PSPI pedestal under the C4 bump; and forming an underfill abutting the PSPI pedestal and the solder, wherein the underfill and the solder form an interface separated from the PSPI pedestal.

In various other particular embodiments, another method is disclosed. This method can include: providing a precursor interconnect structure having: a photosensitive polyimide (PSPI) layer; a controlled collapse chip connection (C4) bump overlying the PSPI layer; and a solder overlying the C4 bump and contacting a side of the C4 bump; recessing a portion of the PSPI layer adjacent to the C4 bump to form a PSPI pedestal under the C4 bump; and forming an underfill abutting the PSPI pedestal and the C4 bump, wherein the underfill and the solder form an interface separated from the PSPI pedestal.

Various additional particular embodiments include an interconnect structure. The interconnect structure can include: a photosensitive polyimide (PSPI) layer including a pedestal portion; a controlled collapse chip connection (C4) bump overlying the pedestal portion of the PSPI layer; a solder overlying the C4 bump and contacting a side of the C4 bump; and an underfill layer abutting the pedestal portion of the PSPI and the C4 bump, wherein the underfill layer and the solder form an interface separated from the PSPI pedestal.

Figure 1:
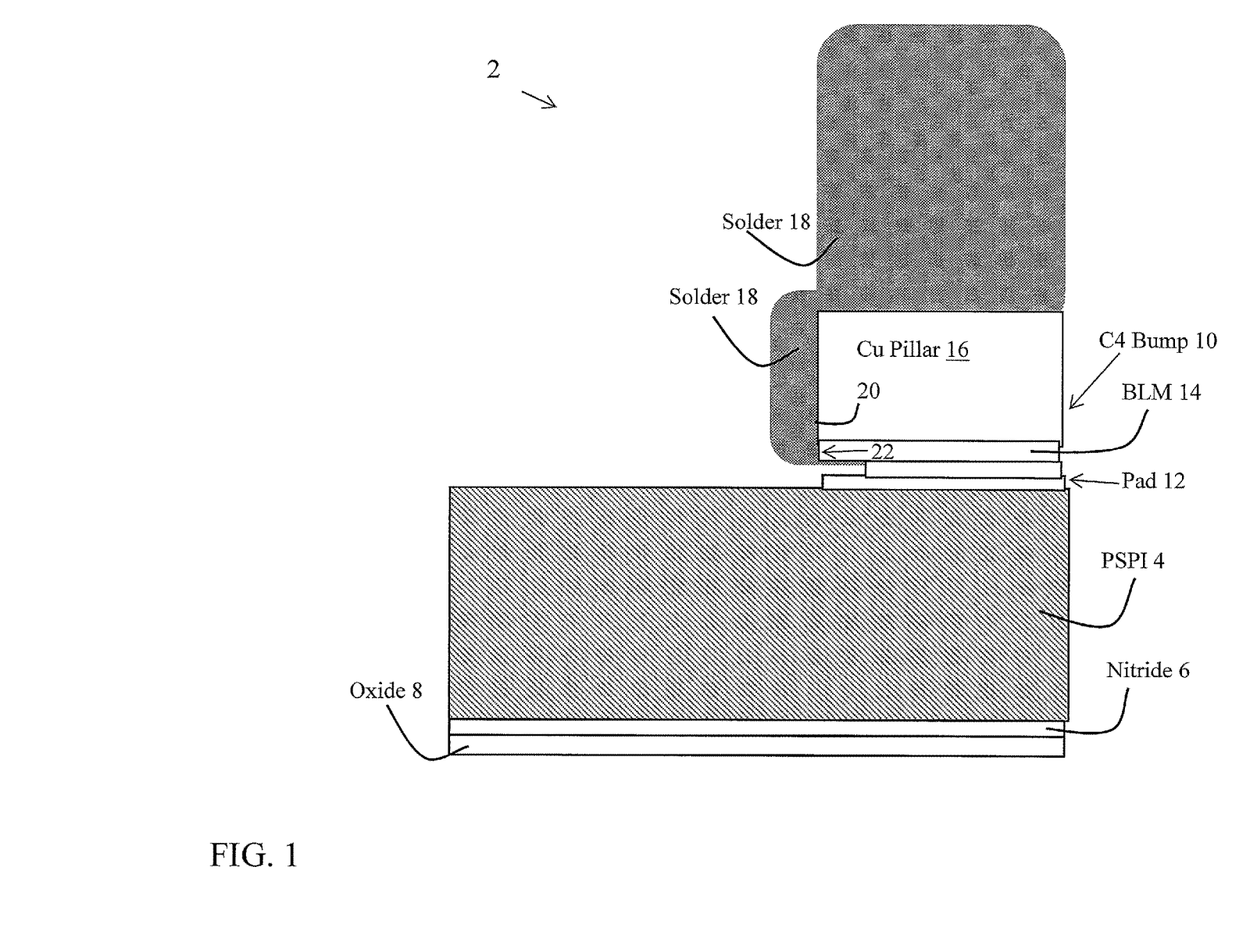
FIG. 1 shows a cross-sectional schematic depiction of a precursor structure according to various embodiments.

Turning to FIG. 1, a schematic cross-sectional view of a precursor structure 2 is shown according to various embodiments of the invention. As shown, the precursor structure 2 can include a photosensitive polyimide (PSPI) layer 4. In various embodiments, the PSPI layer 4 overlies a nitride layer 6, which in turn overlies an oxide 8 (e.g., a substrate). Overlying the PSPI layer 4 is a controlled collapse chip connection (C4) bump 10. The C4 bump can include: a pad 12, a ball limiting metallurgy (BLM) layer 14 over the pad 12, and a thick copper layer 16 (or copper pillar) over the BLM layer 14. In various embodiments, the pad 12 can include at least one of aluminum, copper, or a multilayer metallic structure that includes aluminum and/or copper in combination with one or more refractory metal underlayers e.g. Ti (titanium), TiN (titanium nitride), Ta (tantalum), TaN (tantalum nitride), TiW (titanium-tungsten alloys), etc. The BLM layer 14 is typically comprised of a multilayer refractory metal composite which can include at least one of TiW, Ta, TaN, Ti, TiN, Ni (nickel), Cu (copper), Bi (bismuth), etc. The thick copper layer 16 can include copper, but can also include any other conductive metal layer like Al (aluminum), Au (gold), Ag (silver), or refractory metals like TiW, Ta, TaN, Ti, TiN, Bi, Ni in some alternative embodiments.

As shown, the precursor structure 2 can also include a solder 18 overlying the thick copper (or copper pillar) layer 16 and contacting a side 20 of the thick copper (or copper pillar) layer 16 and a side 22 of the BLM layer 14. That is, the solder 18 can wrap around the upper surface 24 of the thick copper (copper pillar) layer 16 and the side 20 of the thick copper (copper pillar) 16, and contact a side 22 of the BLM layer 14.

Figure 2:
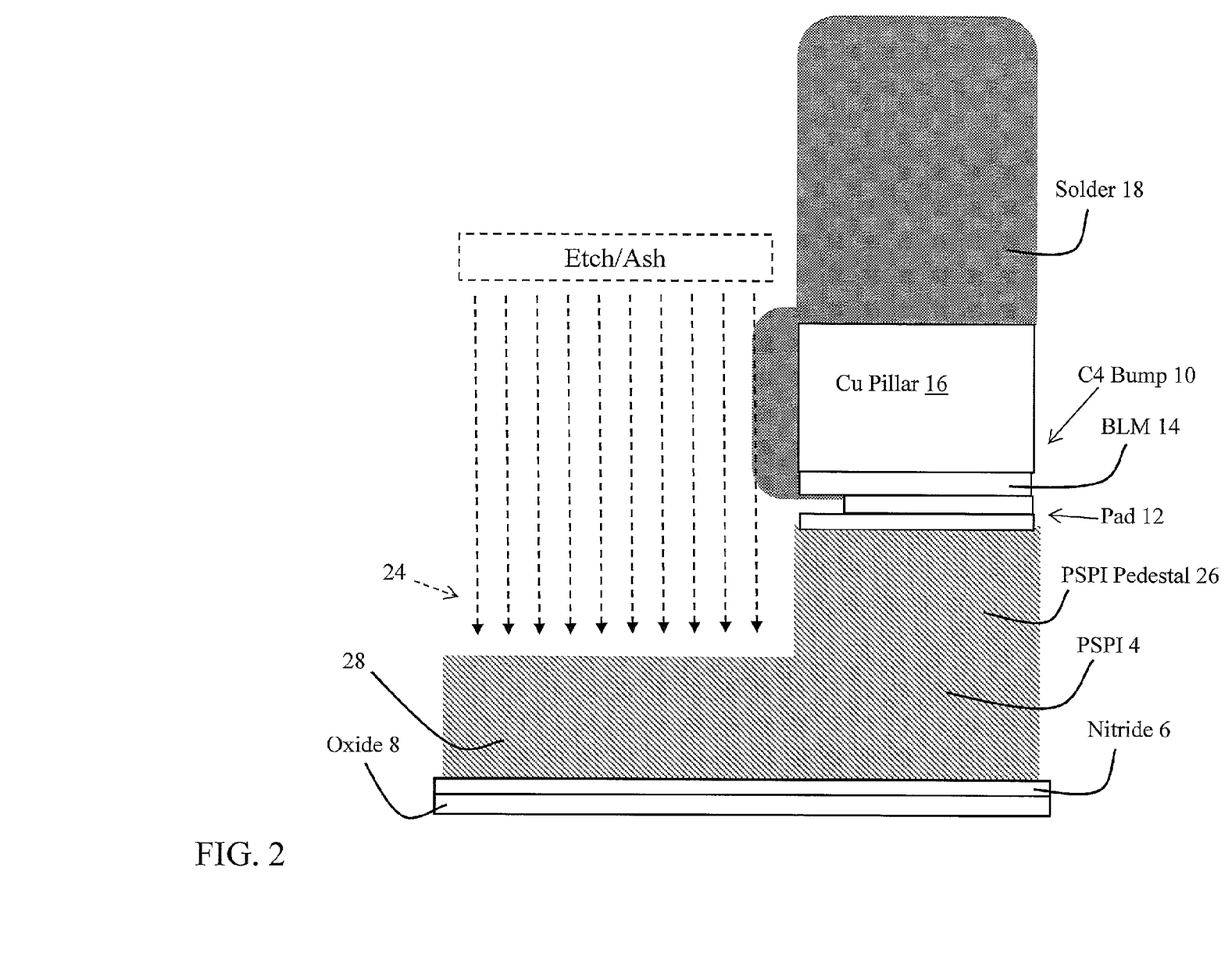
FIG. 2 shows a first process performed on the precursor structure of FIG. 1 according to various embodiments.

FIG. 2 illustrates a first process of according to various embodiments, which includes recessing a portion 24 (indicated by phantom arrow) of the PSPI layer 4 adjacent to the C4 bump 10 to form a PSPI pedestal 26 under the C4 bump 10. In this case, the portion 24 of the PSPI layer 4 is recessed using an ash-based etching (indicated by dashed arrows) or other etching technique. In particular embodiments, the recessing can include oxygen-ash etching of the PSPI layer 4 to leave a remaining portion 28 of the PSPI layer 4 over the nitride 6. That is, the recessing can be performed to prevent exposure of the underlying nitride 6. In this case, the PSPI pedestal 26 can be referred to as a "partial" pedestal, in that it does not stand completely alone (because of its continuity with the remaining portion 28 of the PSPI layer 4). In any case, as shown, recessing of the PSPI layer 4 adjacent to the C4 bump 10 further separates the PSPI layer 4 from the solder 18. As will be described further herein, this can prevent the solder from forming an interface with the PSPI layer 4, which will aid in preventing copper extrusion and/or delamination.

Figure 3:
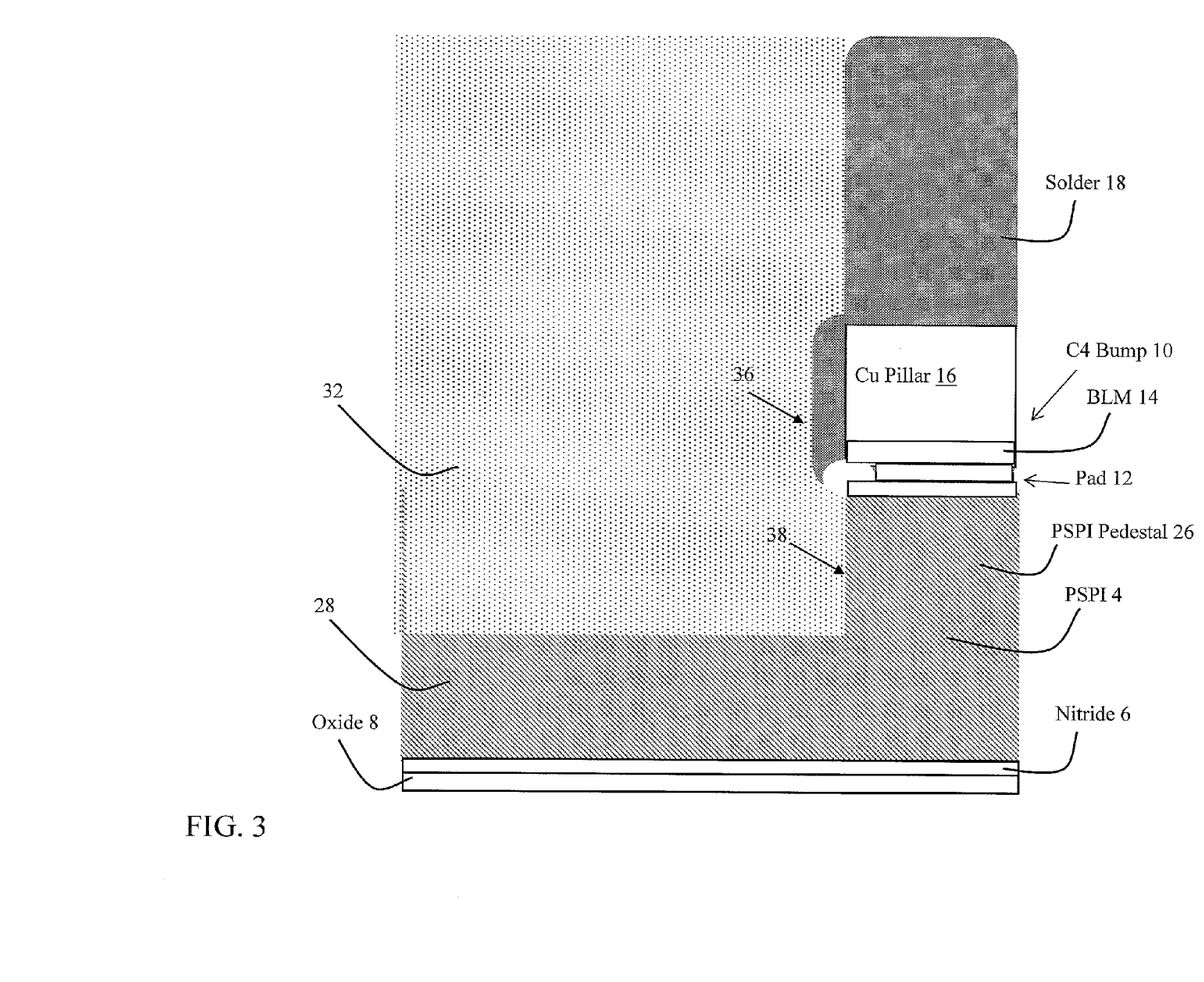
FIG. 3 shows a process performed on the structure of FIG. 2 according to various embodiments.

FIG. 3 illustrates another process according to various embodiments of the invention. This process can include forming an underfill (e.g., underfill layer) 32 abutting the PSPI pedestal 26 (e.g., along a sidewall of the pedestal 26) and the solder 18 (e.g., along the sidewall 35 of the solder 18). As shown, the underfill 32 and the solder 18 form an interface 36 separated from the PSPI pedestal 26. That is, the underfill 32 forms a first interface 36 with the solder 18 and a second interface 38 with the PSPI pedestal 26, where the first interface 36 and the second interface 38 are physically separated. In some embodiments, the forming of the underfill 32 includes depositing the underfill 32 over the remaining portion 28 of the PSPI layer 4 adjacent to the PSPI pedestal 26. In some cases, the underfill 32 includes a photosensitive polyimide (PSPI), e.g., similar to PSPI layer.

Figure 4:
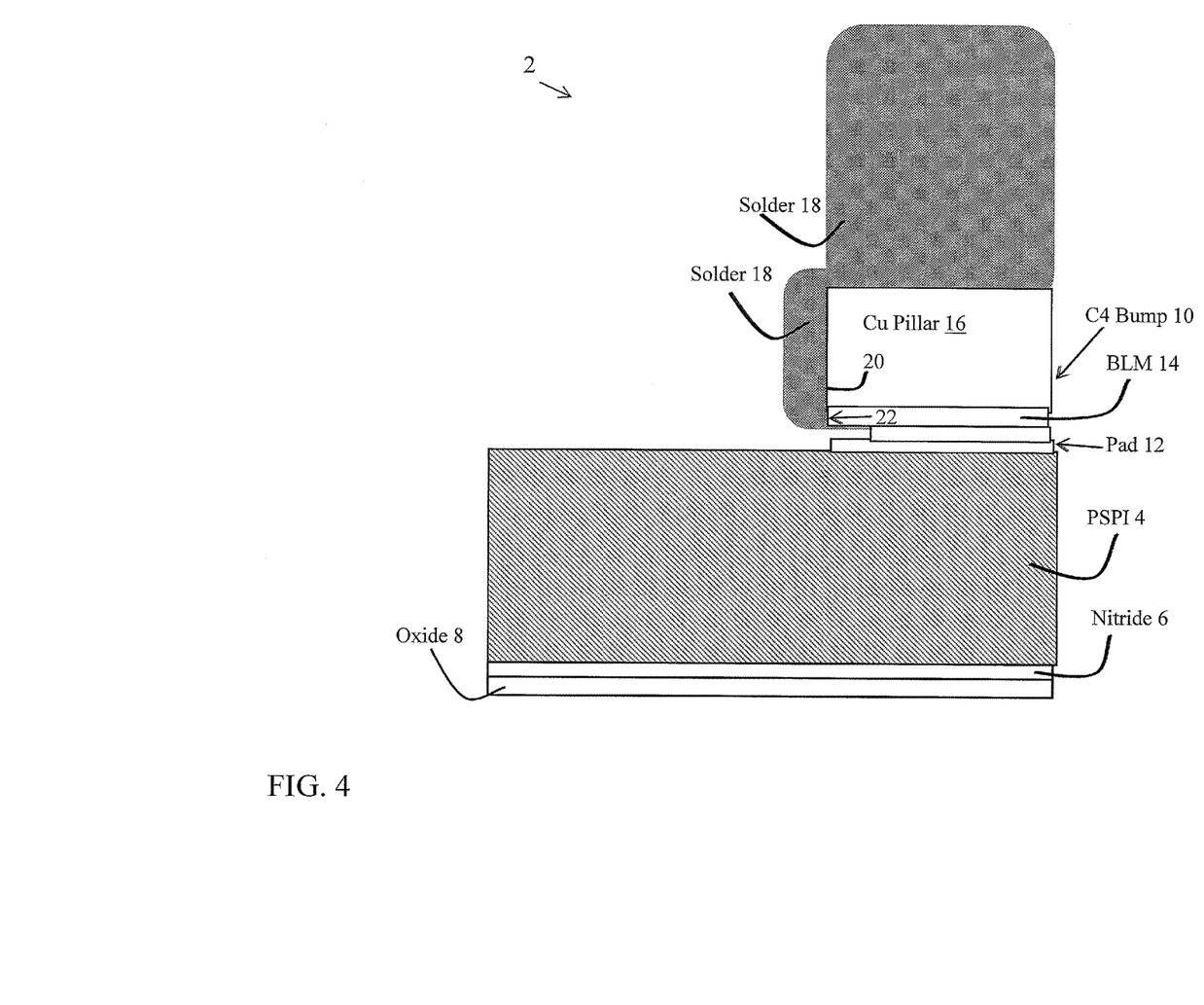
FIG. 4 shows a cross-sectional schematic depiction of a precursor structure according to various embodiments.

FIG. 4 shows the precursor structure 2 of FIG. 1, which will be used to illustrate another method according to various alternative embodiments of the invention. Description of features in precursor structure 2 are omitted to avoid redundancy (and are included with the description of FIG. 1.

Figure 5:
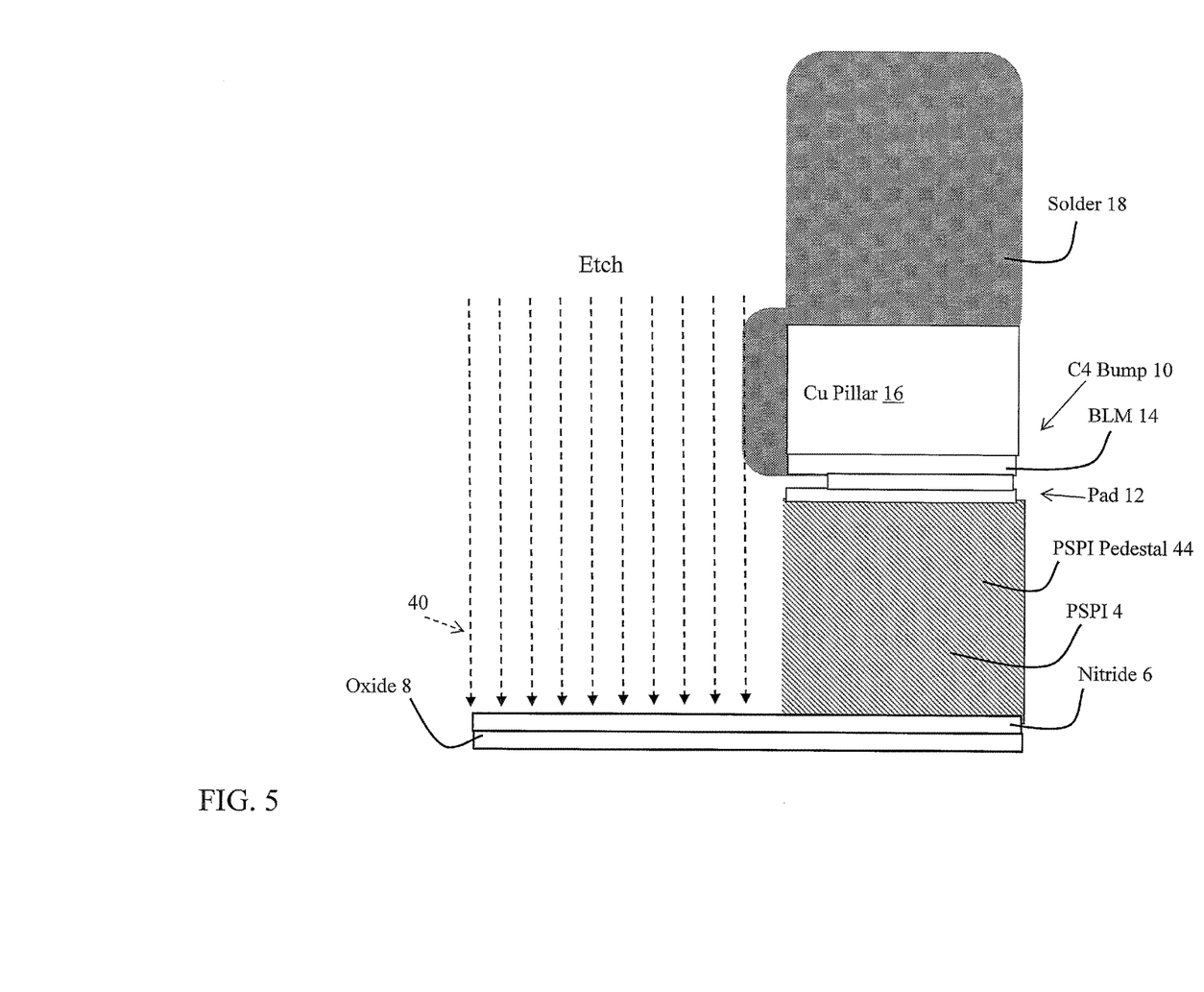
FIG. 5 shows a first process performed on the precursor structure of FIG. 4 according to various alternate embodiments.

FIG. 5 illustrates a process according to various alternate embodiments of the invention, which includes recessing a portion 40 (illustrated in phantom) of the PSPI layer 4 completely through the PSPI layer 4 to expose the nitride layer 6. In this embodiment, the recessing can include etching through the portion 40 of the PSPI layer 4 to contact the nitride layer 6. In particular embodiments, the etching can include reactive ion etching (or, RIE etching). In more particular embodiments, the etching can include oxygen-based RIE etching. Regardless of the etching technique used, in these alternate embodiments, the PSPI layer 4 is recessed to expose the nitride layer 6. This process creates a "full" PSPI pedestal 44, which stands isolated over the nitride layer 6.

Figure 6:
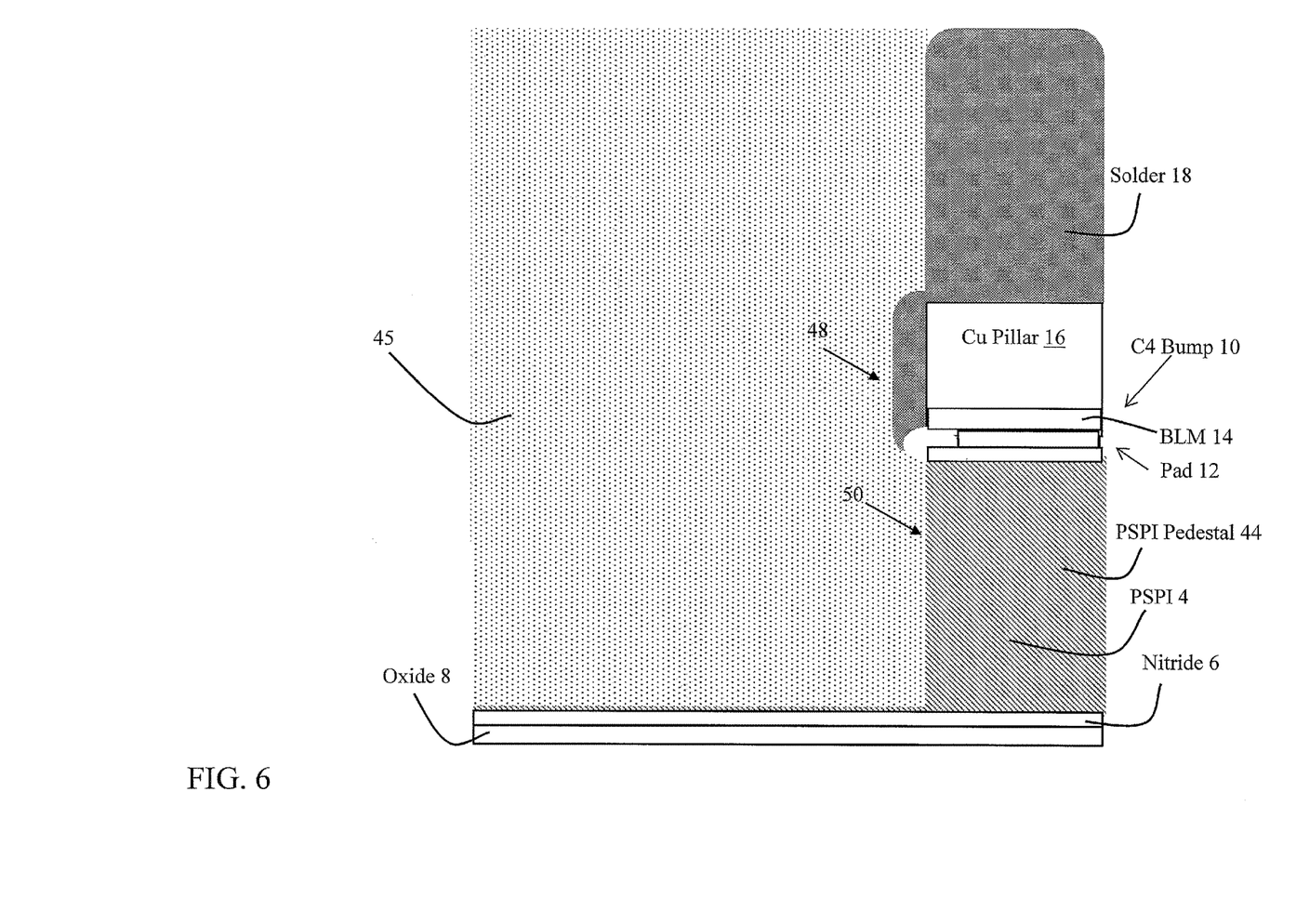
FIG. 6 shows a process performed on the structure of FIG. 5 according to various alternate embodiments.

FIG. 6 illustrates another process according to various embodiments of the invention. This process can include forming an underfill (e.g., underfill layer) 45 abutting the PSPI pedestal 44 (e.g., along a sidewall of the pedestal 44) and the solder 18 (e.g., along the sidewall of the solder). As shown, the underfill 45 and the solder 18 form an interface 48 separated from the PSPI pedestal 44. That is, the underfill 45 forms a first interface 48 with the solder 48 and a second interface 50 with the PSPI pedestal 44, where the first interface 48 and the second interface 50 are physically separated. In some embodiments, the forming of the underfill 45 includes depositing the underfill 45 over the nitride layer 6. In some cases, the underfill 45 can include at least one of nitrogen or oxygen.

Figure 7:
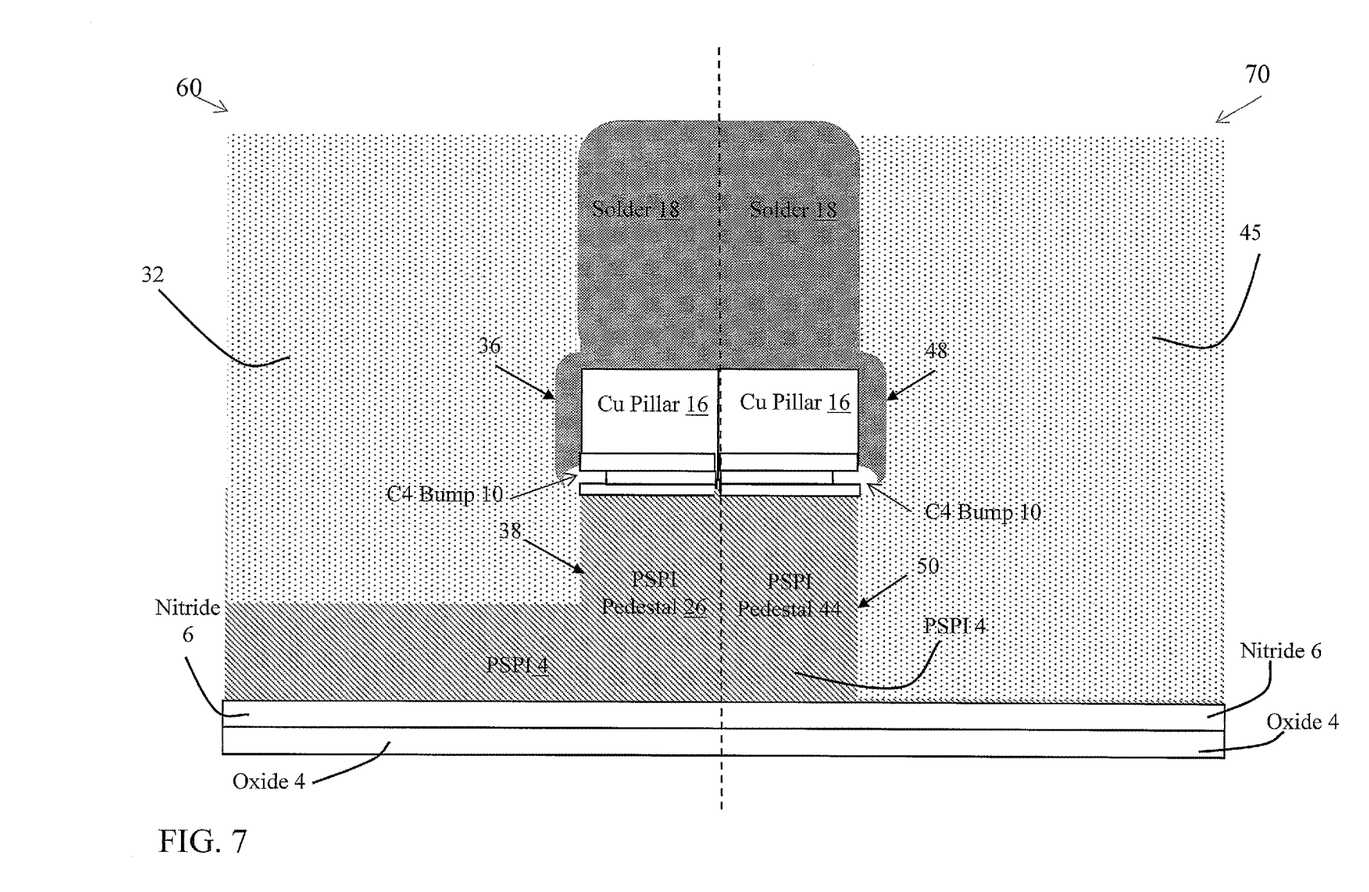
FIG. 7 shows a side-by-side cross sectional depiction of interconnect structures according to various embodiments.

FIG. 7 shows a side-by-side cross-sectional view of two interconnect structures 60, 70, each formed according to various embodiments described herein. As shown, the structure 60 on the left includes the "partial" PSPI pedestal 26, while the structure 70 on the right includes a "full" PSPI pedestal 44. Both structures 60, 70 can include an oxide layer 4, a nitride layer 6 over the oxide layer 4, and a PSPI layer 4 over the nitride layer 6. Over the PSPI layer 4 is a C4 bump 10 (which can include: a pad 12, a ball limiting metallurgy (BLM) layer 14 over the pad 12, and a thick copper layer (or copper pillar) 16 over the BLM layer 14, all described herein with reference to FIG. 1). Both structures 60, 70 include a solder layer (also known as a solder bump) 18 over the thick copper (copper pillar) layer 16 of the C4 bump 10. Both structures 60, 70 include respective underfill materials 32, 45. Structure 60 can include underfill 32, which can include a PSPI or similar material. Structure 70 can include underfill 45, which can include nitrogen and/or oxygen-based underfill material. In both structures 60, 70, an interface (36, 48) between the underfill (32, 45) and solder 18 is separated from an interface (38, 50) between the underfill (32, 45) and the PSPI pedestal (26, 44).

Figure 8:
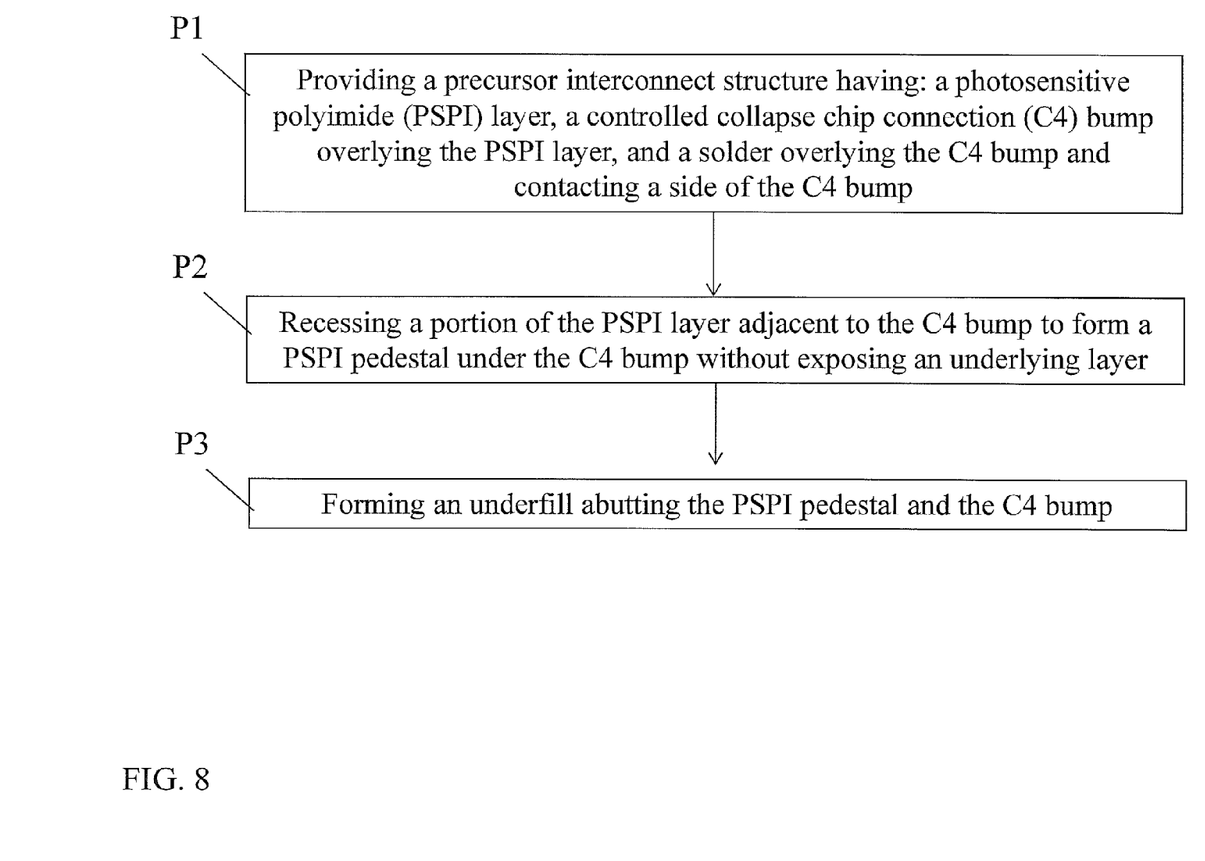
FIG. 8 shows a flow diagram illustrating processes according to embodiments.

As described herein, various particular embodiments of the invention include a method of forming an interconnect structure (e.g., interconnect structure 60 and/or 70, FIG. 7). FIG. 8 illustrates a process flow in forming an interconnect structure 60, which can include the following processes:

Process P1: providing a precursor interconnect structure having: a photosensitive polyimide (PSPI) layer, a controlled collapse chip connection (C4) bump overlying the PSPI layer, and a solder overlying the C4 bump and contacting a side of the C4 bump;

Process P2: recessing a portion of the PSPI layer adjacent to the C4 bump to form a PSPI pedestal under the C4 bump without exposing an underlying layer (e.g. nitride); and Process P3: forming an underfill abutting the PSPI pedestal and the C4 bump. As noted herein, the underfill and the solder form an interface separated from the PSPI pedestal.

Figure 9:
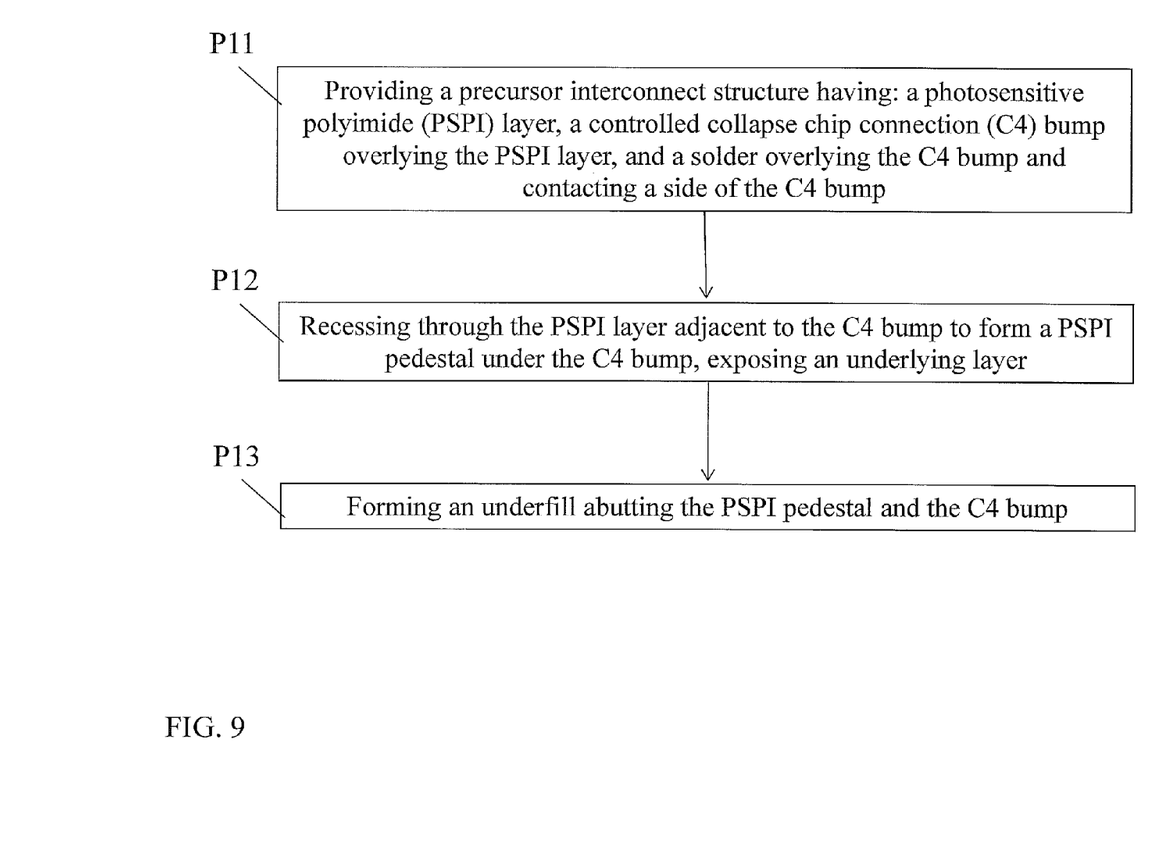
FIG. 9 shows a flow diagram illustrating processes according to alternate embodiments.

FIG. 9 shows an alternative process flow in forming an interconnect structure (e.g., interconnect structure 70 in FIG. 7), which can include the following processes:

Process P11: providing a precursor interconnect structure having: a photosensitive polyimide (PSPI) layer, a controlled collapse chip connection (C4) bump overlying the PSPI layer, and a solder overlying the C4 bump and contacting a side of the C4 bump;

Process P12: recessing through the PSPI layer adjacent to the C4 bump to form a PSPI pedestal under the C4 bump, exposing an underlying layer (e.g. nitride); and Process P13: forming an underfill abutting the PSPI pedestal and the C4 bump. As noted herein, the underfill and the solder form an interface separated from the PSPI pedestal.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:
1. An interconnect structure comprising:
  a photosensitive polyimide (PSPI) layer including a pedestal portion;
  a controlled collapse chip connection (C4) bump overlying the pedestal portion of the PSPI layer, the C4 bump including:
    a pad;
    a ball limiting metallurgy (BLM) layer over the pad; and
    a thick copper layer over the BLM layer;
  a solder overlying the thick copper layer and directly contacting a side of the thick copper layer and a side of the BLM layer, wherein a gap is located between the solder and the pedestal portion; and
  an underfill layer directly contacting the pedestal portion of the PSPI and the solder, wherein the underfill layer and the solder form a first interface separated from the pedestal portion, and wherein the underfill and the pedestal portion form a second interface, wherein the first interface and the second interface are separated by the gap.

2. The interconnect structure of claim 1, wherein the solder is completely isolated from the PSPI layer.

3. The interconnect structure of claim 1, wherein the underfill layer includes PSPI.

4. The interconnect structure of claim 1, further comprising a nitride layer beneath the PSPI layer.

5. The interconnect structure of claim 4, wherein the underfill directly contacts the nitride layer.

6. An interconnect structure comprising:
   a photosensitive polyimide (PSPI) layer including a pedestal portion;
   a controlled collapse chip connection (C4) bump overlying the pedestal portion of the PSPI layer, wherein the C4 bump includes:
   a pad;
   a ball limiting metallurgy (BLM) layer over the pad; and
   a thick copper layer over the BLM layer;
   a solder overlying the C4 bump and directly contacting a side of the C4 bump, wherein the solder is completely isolated from the PSPI layer, wherein a gap is located between the solder and the pedestal portion; and
   an underfill layer abutting the pedestal portion of the PSPI and the C4 bump, wherein the underfill layer and the solder form a first interface separated from the pedestal portion, and wherein the underfill and the pedestal portion form a second interface, wherein the first interface and the second interface are separated by the gap.

7. The interconnect structure of claim 6, wherein the solder overlies the thick copper layer and directly contacts a side of the thick copper layer, and wherein the solder directly contacts a side of the BLM layer.

8. The interconnect structure of claim 6, wherein the underfill layer includes PSPI.

9. The interconnect structure of claim 6, further comprising a nitride layer beneath the PSPI layer, wherein the underfill directly contacts the nitride layer.

* * * * *